United States Patent
Matsuyama

(10) Patent No.: US 11,268,833 B2
(45) Date of Patent: Mar. 8, 2022

(54) REFLECTION TYPE SENSOR AND OPTICAL ENCODER HAVING THE SAME

(71) Applicant: CANON PRECISION INC., Hirosaki (JP)

(72) Inventor: Kazuki Matsuyama, Hirosaki (JP)

(73) Assignee: CANON PRECISION INC., Aomori-ken (JP)

( * ) Notice: Subject to any disclaimer, the term of this patent is extended or adjusted under 35 U.S.C. 154(b) by 0 days.

(21) Appl. No.: 17/088,122

(22) Filed: Nov. 3, 2020

(65) Prior Publication Data

US 2021/0140801 A1 May 13, 2021

(30) Foreign Application Priority Data

Nov. 7, 2019 (JP) .............................. JP2019-202624

(51) Int. Cl.
G01D 5/347 (2006.01)
H01L 31/0203 (2014.01)
H01L 31/173 (2006.01)

(52) U.S. Cl.
CPC ..... *G01D 5/34715* (2013.01); *G01D 5/34753* (2013.01); *H01L 31/0203* (2013.01); *H01L 31/173* (2013.01)

(58) Field of Classification Search
CPC ............ G01D 5/34715; G01D 5/34753; H01L 31/0203; H01L 31/173
See application file for complete search history.

(56) References Cited

U.S. PATENT DOCUMENTS

| 2009/0242742 A1 | 10/2009 | Hane et al. |
| 2010/0165359 A1 | 7/2010 | Hane |
| 2010/0243871 A1 | 9/2010 | Hane |

FOREIGN PATENT DOCUMENTS

| EP | 1882908 A2 | | 1/2008 |
| JP | 2005156549 A | * | 6/2005 |
| JP | 2010223629 A | * | 10/2010 |
| JP | 2010223630 A | * | 10/2010 |
| JP | 2010223636 A | * | 10/2010 |
| JP | 2013-070078 A | | 4/2013 |

OTHER PUBLICATIONS

EPO; "Extended European Search Report;" 80298 Munich, Germany; 021-02-04; pp. 1-7.

* cited by examiner

*Primary Examiner* — Thanh Luu
*Assistant Examiner* — Monica T Taba
(74) *Attorney, Agent, or Firm* — Canon U.S.A., Inc. IP Division

(57) ABSTRACT

A reflection type sensor includes a light emitting element configured to emit light, a light receiving element configured to receive reflected light from a scale having a pattern, and a transparent member configured to cover the light emitting element and the light receiving element. A predetermined condition is satisfied.

9 Claims, 15 Drawing Sheets

REFLECTION TYPE SENSOR AND OPTICAL ENCODER HAVING THE SAME

BACKGROUND OF THE INVENTION

Field of the Invention

The present invention relates to a reflection type sensor and an optical encoder having the same.

Description of the Related Art

Conventionally, a reflection type sensor has been known in which a light receiving element receives reflected light from a measurement target irradiated with light from a light emitting element, and a displacement of the measurement target is detected by a change in the reflected light amount. The reflection type sensor has a problem in that, of the light emitted from the light emitting element, the light totally reflected on a transparent member covering the light emitting element and the light receiving element and incident on the light receiving element is superimposed as noise light on sensor signal light. Japanese Patent Laid-Open No. ("JP") 2013-70078 discloses a reflection type sensor in which a light receiving area of a light receiving element is provided to a side closer to the light emitting element than the light totally reflected on the top surface of the transparent member.

However, in the reflection type sensor disclosed in JP 2013-70078, the light that is totally reflected on the top surface of the transparent member and then totally reflected by a side surface of the transparent member and enters the light receiving element may be superimposed as the noise light on the sensor signal light.

SUMMARY OF THE INVENTION

The present invention provides a compact reflection type sensor and an optical encoder having the same, each of which can reduce influence of internally reflected light.

A reflection type sensor according to one aspect of the present invention includes a light emitting element configured to emit light, a light receiving element configured to receive reflected light from a scale having a pattern, and a transparent member configured to cover the light emitting element and the light receiving element. The following conditional expression is satisfied:

$$D1(G+J)/\tan\theta$$

where G is a distance from a light emitter in the light emitting element to a top surface of the transparent member, J is a distance from a light receiver in the light receiving element to the top surface, θ is an angle at which light emitted from the light emitter is totally reflected on the transparent member, the light receiver is located between a first end of the light emitter and a position apart from the first end by a distance R defined as follows, and $$R=(G+J)\times\tan\theta$$

D1 is a distance from a second end facing the first end of the light emitter to a side surface of the transparent member.

An optical encoder having the above reflection type sensor also constitutes another aspect of the present invention.

Further features of the present invention will become apparent from the following description of exemplary embodiments with reference to the attached drawings.

DESCRIPTION OF THE EMBODIMENTS

Figure 1:
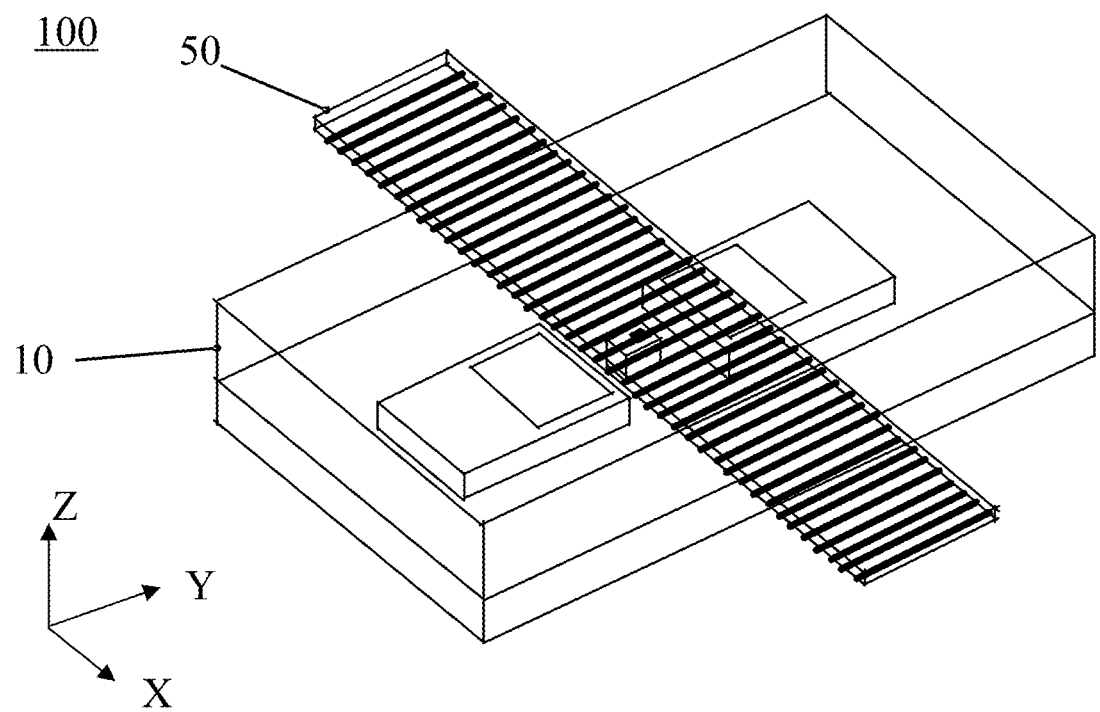
FIG. 1 is an external view of an optical encoder according to a first embodiment.

Referring now to the accompanying drawings, a detailed description will be given of embodiments according to the present invention. Corresponding elements in respective figures will be designated by the same reference numerals, and a duplicate description thereof will be omitted.

The optical encoder described in each of the embodiments is used for various devices such as an optical apparatus, and can detect a position of a movable member according to a relative movement between a scale and a reflection type sensor according to a movement of a movable member in the optical apparatus.

First Embodiment

FIG. 1 is an external view of an optical encoder 100 according to this embodiment. The optical encoder 100 includes a reflection type sensor 10 and a scale 50. The reflection type sensor 10 and the scale 50 are provided so as to face each other. The scale 50 is fixed to a movable member (not shown), and is movable in the X axis direction.

Figure 2:
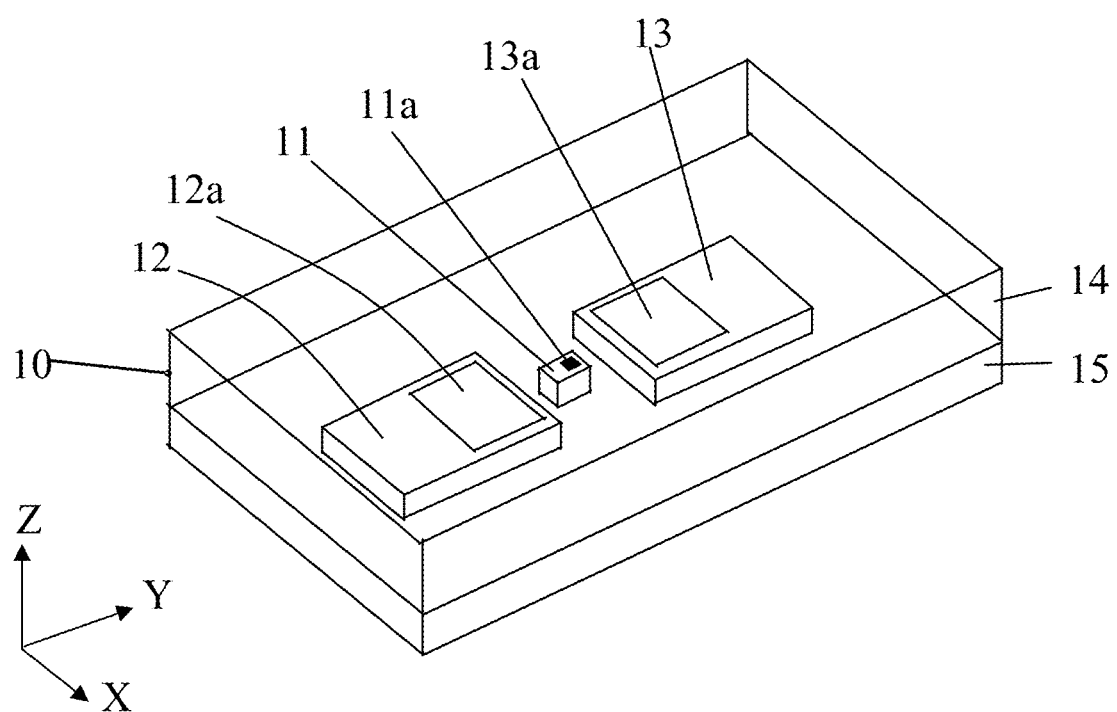
FIG. 2 is an external view of a reflection type sensor according to the first embodiment.
Figure 3:
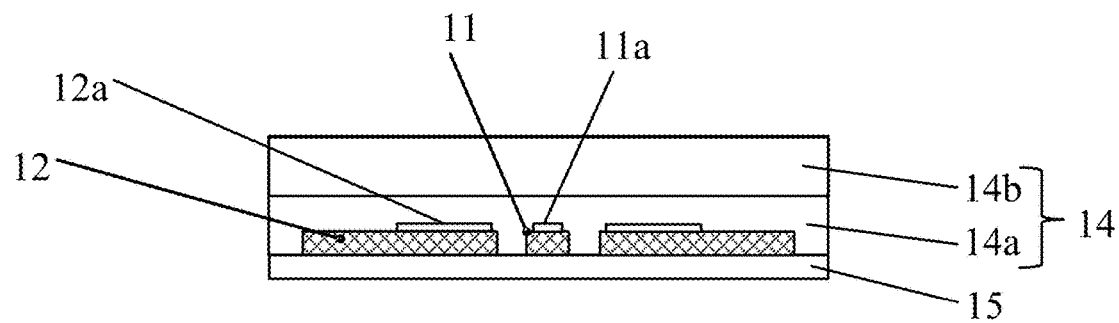
FIG. 3 is a side view of the reflection type sensor according to the first embodiment.

FIGS. 2 and 3 are an external view and a side view of the reflection type sensor 10 according to this embodiment, respectively. The reflection type sensor 10 includes a light emitting element 11, light receiving elements 12 and 13, a transparent member 14, and a nonreflective member 15. The light emitting element 11 includes a light emitter 11a that emits light. The light receiving elements 12 and 13 have the light receivers 12a and 13a that receive the light emitted from the light emitter 11a and reflected by the scale 50, respectively. The light emitting element 11 and the light receiving elements 12 and 13 are arranged on the nonreflective member 15. In this embodiment, the reflection type sensor 10 has two light receiving elements 12 and 13, but the number of light receiving elements is not limited to this embodiment. Only a single light receiving element may be provided, or three or more light receiving elements may be provided.

The transparent member 14 includes a transparent resin 14a and a transparent glass 14b disposed on the transparent resin 14a, and covers the light emitting element 11 and the light receiving elements 12 and 13. Since the transparent resin 14a and the transparent glass 14b have substantially equal refractive indexes, they can be regarded as optically substantially integrated members, and the boundary line between them can be ignored. The transparent member 14 may be made only of the transparent resin 14a.

Figure 4:
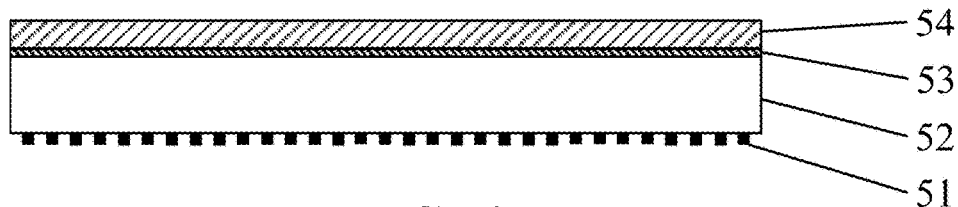
FIG. 4 is a side view of a scale according to the first embodiment.

FIG. 4 is a side view of the scale 50. The scale 50 is a transparent member 52 having a pattern (lattice) 51 including reflectors (black parts in the drawing) and non-reflectors (white parts in the drawing) alternately arranged at a constant cycle (pitch), and a nonreflective member 54 are joined together by an adhesive 53.

Figure 5:
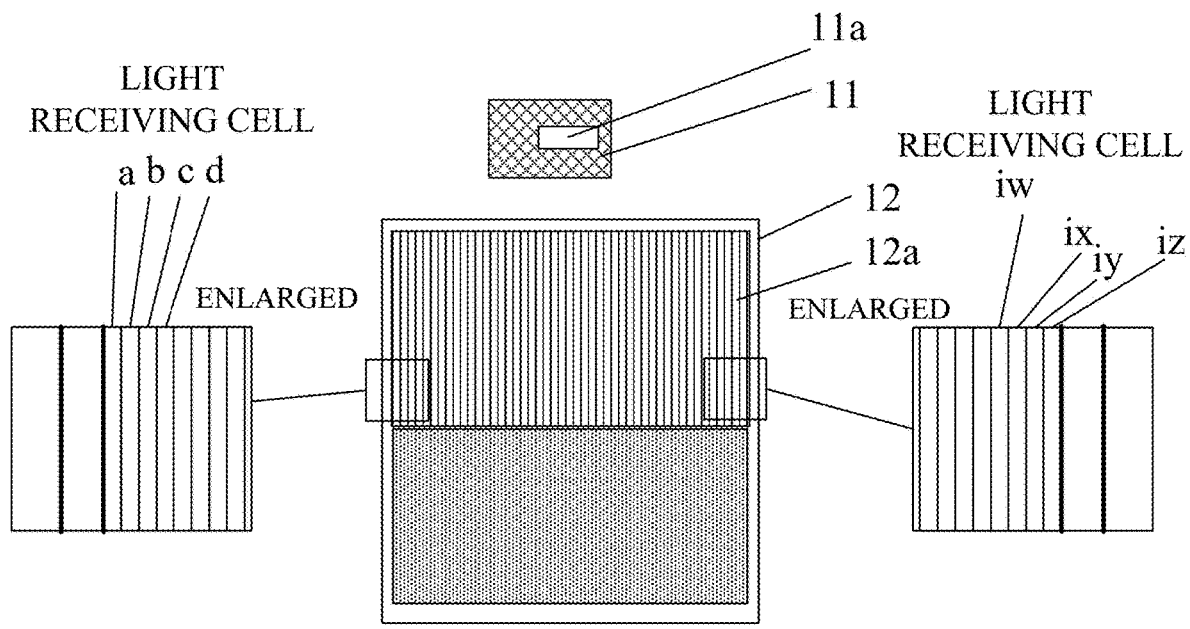
FIG. 5 is a plan view of principal parts in the reflection type sensor according to the first embodiment.

FIG. 5 is a plan view of the light emitting element 11 and the light receiving element 12, which are the principal parts of the reflection type sensor 10. In the light receiver 12a, light receiving cells a, b, c, d, . . . , iw, ix, iy, and iz are arranged at regular intervals along the horizontal direction of the drawing.

Figure 6:
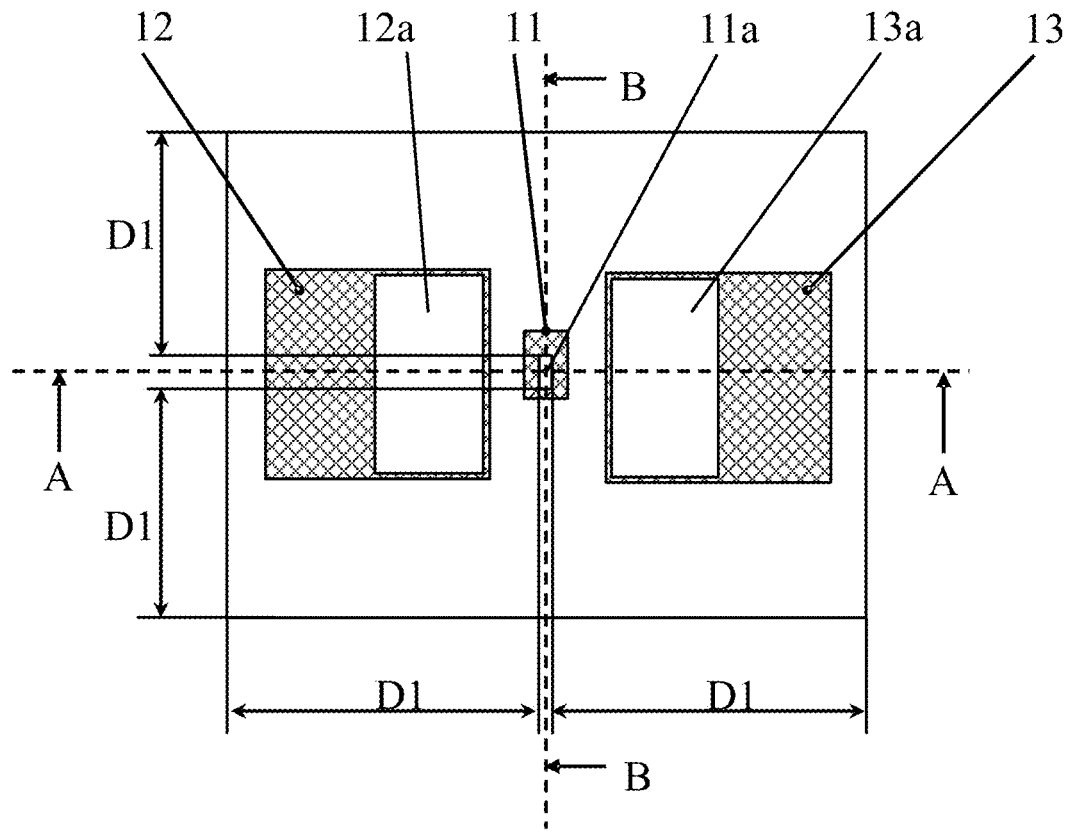
FIG. 6 is a top view of the reflection type sensor according to the first embodiment.
Figure 7:
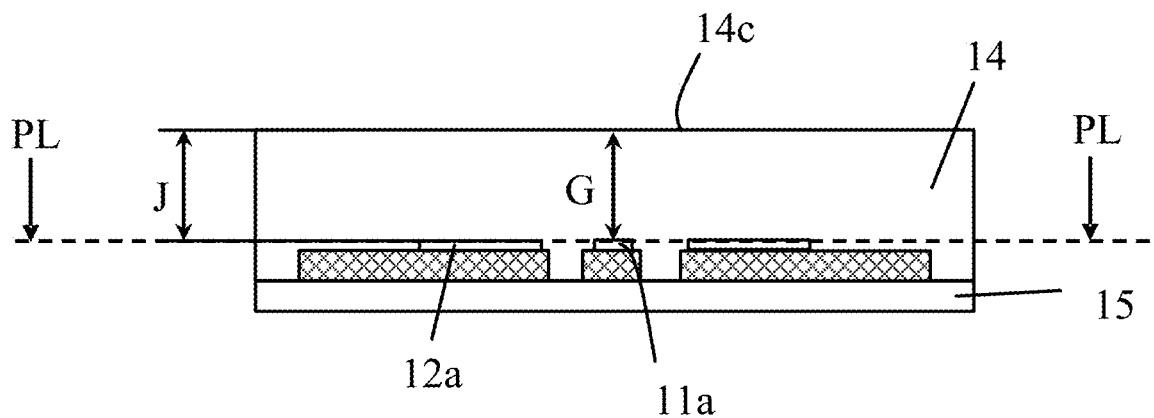
FIG. 7 is a side view of the reflection type sensor according to the first embodiment.
Figure 8:
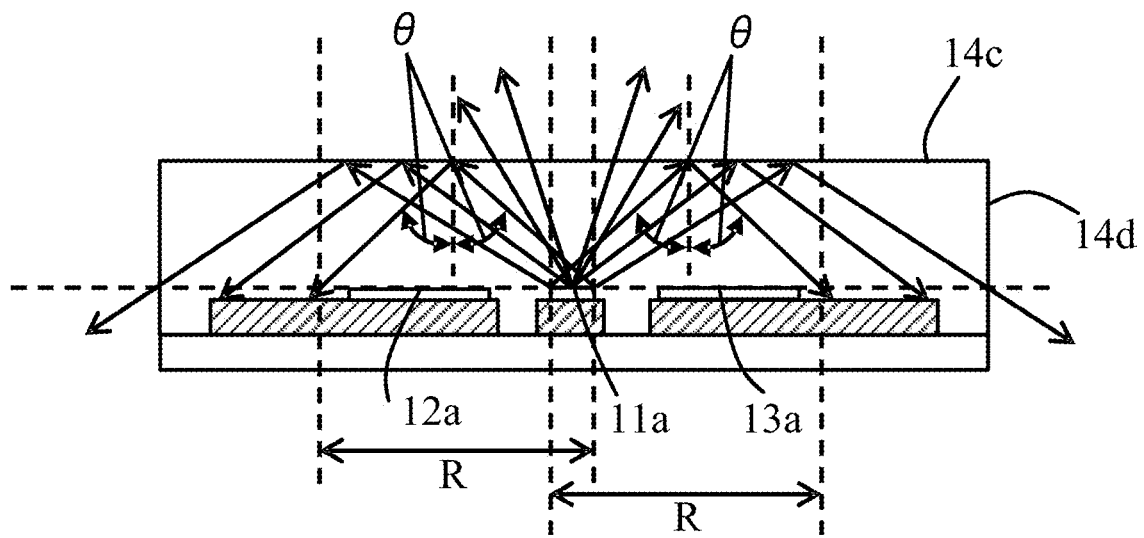
FIG. 8 is a sectional view taken along a line A-A in FIG. 6.
Figure 9:
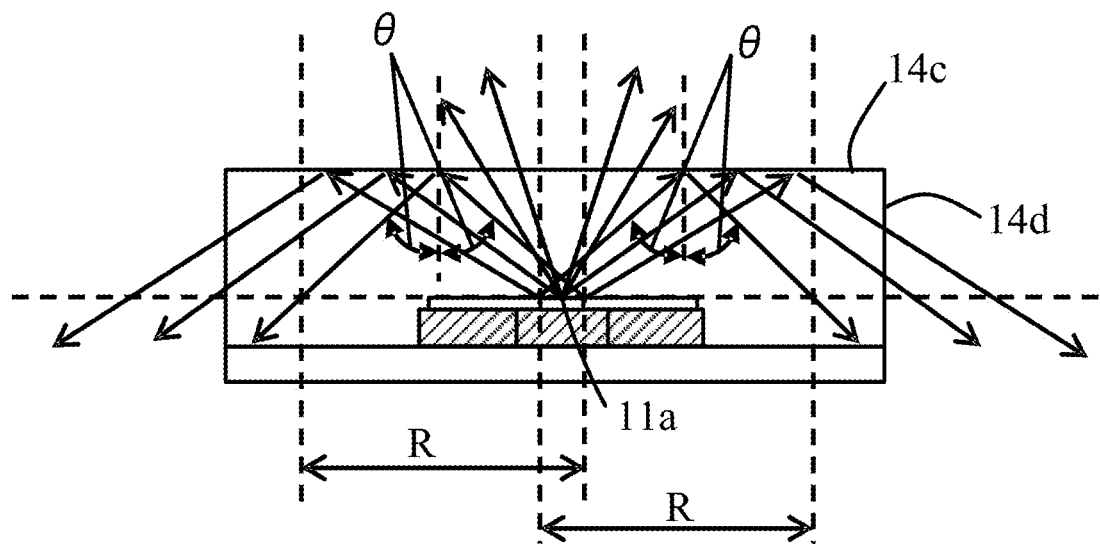
FIG. 9 is a sectional view taken along a line B-B in FIG. 6.

FIGS. 6 and 7 are a top view and a side view of the reflection type sensor 10, respectively. FIGS. 8 and 9 are a sectional view taken along a line A-A and a sectional view taken along the line B-B in FIG. 6, respectively.

A light emitter 11a in the light emitting element 11 is located apart from a top surface 14c of the transparent member 14 by a distance G. A light receiver 12a (13a) in the light receiving element 12 (13) is located apart from the top surface 14c by a distance J. The distance G from the light emitter 11a to the top surface 14c may be equal to the distance J from the light receiver 12a (13a) to the top surface 14c. Here, "equal" includes not only strictly equal but also approximately equal (substantially equal). In other words, this embodiment maintains sufficiently small a difference in height between the light emitting surface of the light emitter 11a and the light receiving surface of the light receiver 12a.

A description will now be given of light emitted from the light emitter 11a incident on the top surface 14c at an angle θ at which the transparent member 14 totally reflects the light. As illustrated in FIGS. 8 and 9, the light emitted from the light emitter 11a is totally reflected on the top surface 14c and propagates in the reflection type sensor 10. At this time, the light totally reflected on the top surface 14c does not enter an area inside a position apart from the end (first end) of the light emitter 11a by a distance R determined by the following expression (1) (or an area within a circle having a distance (radius) R centered on the end of the light emitter 11a):

$$R = (G+J) \times \tan \theta \quad (1)$$

The light totally reflected on the top surface 14c is noise light irrelevant to the sensor signal light. Accordingly, this embodiment disposes the light receivers 12a and 13a between the end of the light emitter 11a and the position separated from the end position by the distance R. This configuration can restrain the noise light totally reflected on the top surface 14c from entering the light receivers 12a and 13a. The end (second end) facing the end (first end) of the light emitter 11a is located between the end (first end) of the light emitter 11a and the position separated from the first end by the distance R.

Figure 10:
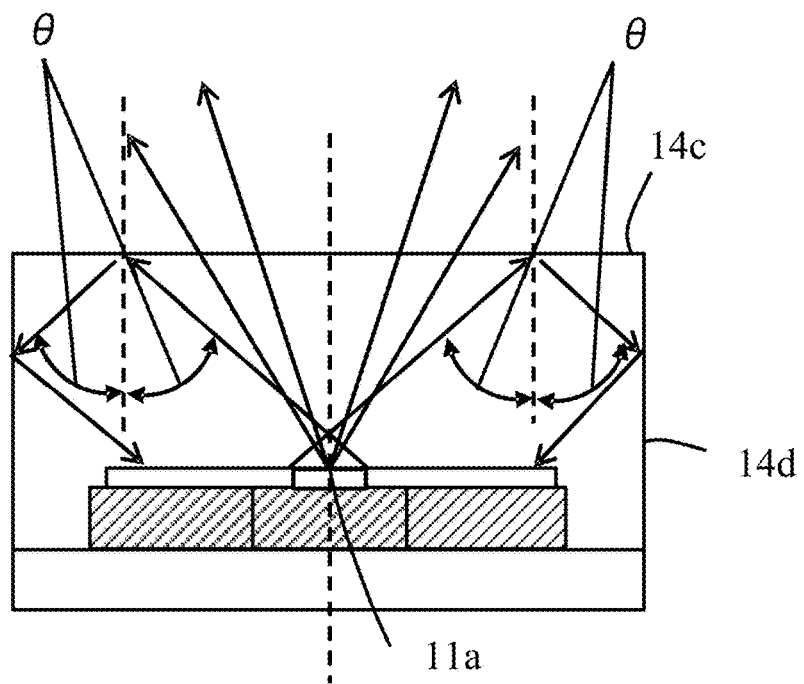
FIG. 10 is a sectional view corresponding to the sectional view taken along the line B-B in FIG. 6 when the conditional expression (2) is not satisfied.

The transparent member 14 and the reflection type sensor 10 can be made compact by bringing the side surface 14d of the transparent member 14 closer to the light emitter 11a side. However, if the side surface 14d is made too close to the light emitter 11a side, the light totally reflected by the top surface 14c and then totally reflected by the side surface 14d may enter the light receivers 12a and 13a as shown in FIG. 10. Accordingly, in this embodiment, a distance D1 from the end (second end) of the light emitter 11a to the side surface 14d satisfy the following conditional expression (2).

$$D1 (G+J)/\tan \theta \quad (2)$$

Satisfying conditional expression (2) can restrain the light totally reflected from the top surface 14c and the side surface 14d from entering the light receivers 12a and 13a.

Figure 11:
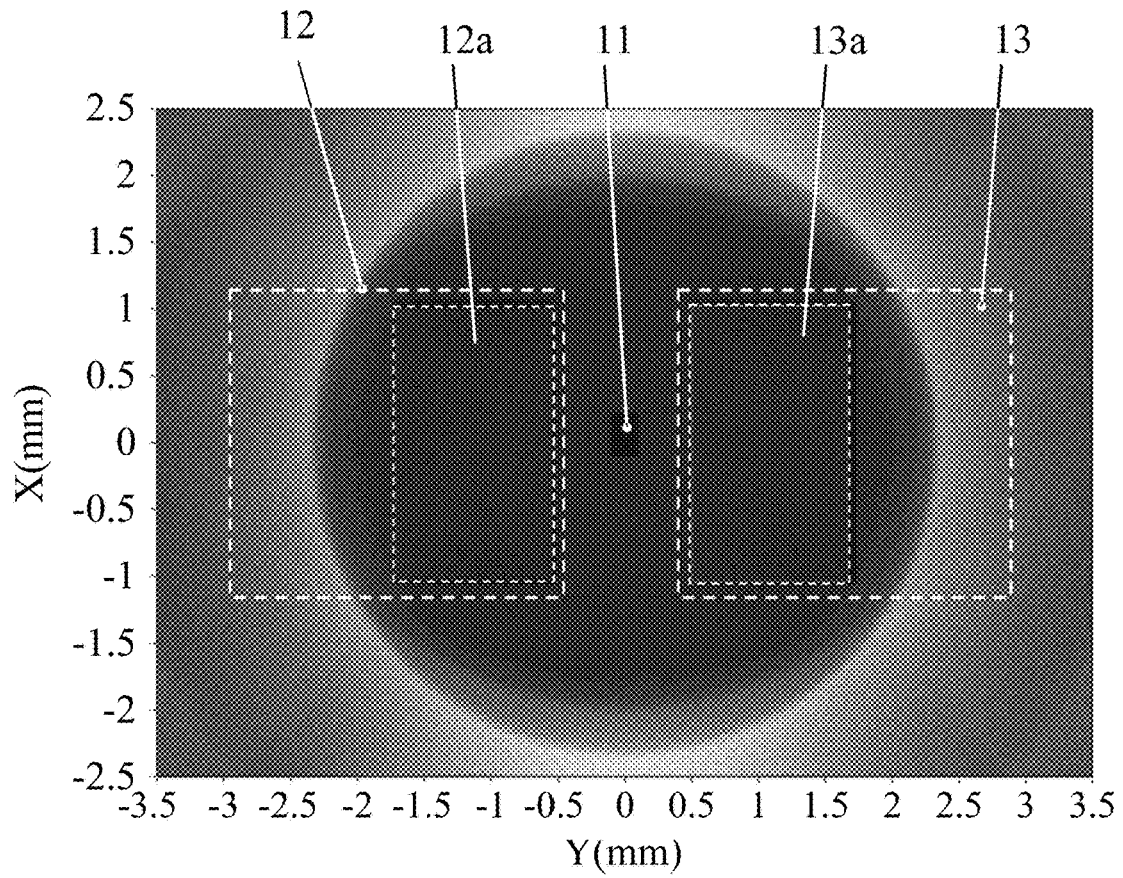
FIG. 11 is an illuminance distribution diagram in a section taken along a line PL-PL in FIG. 7 when the conditional expression (2) is satisfied.
Figure 12:
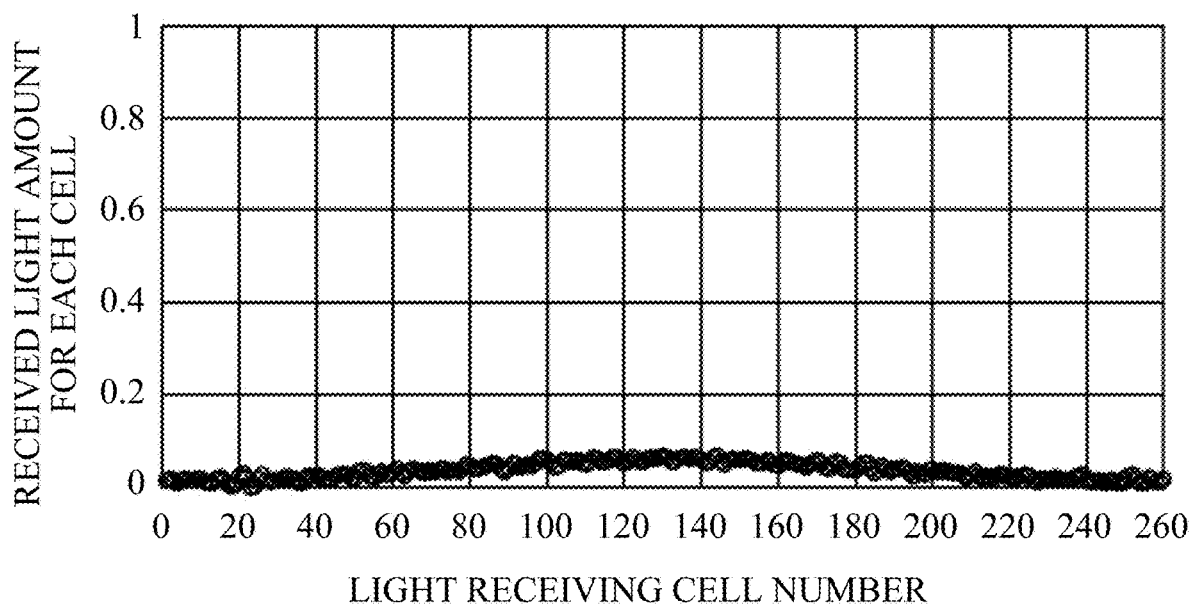
FIG. 12 is a graph of a received light amount in each light receiving cell in the light receiving element in FIG. 11.
Figure 13:
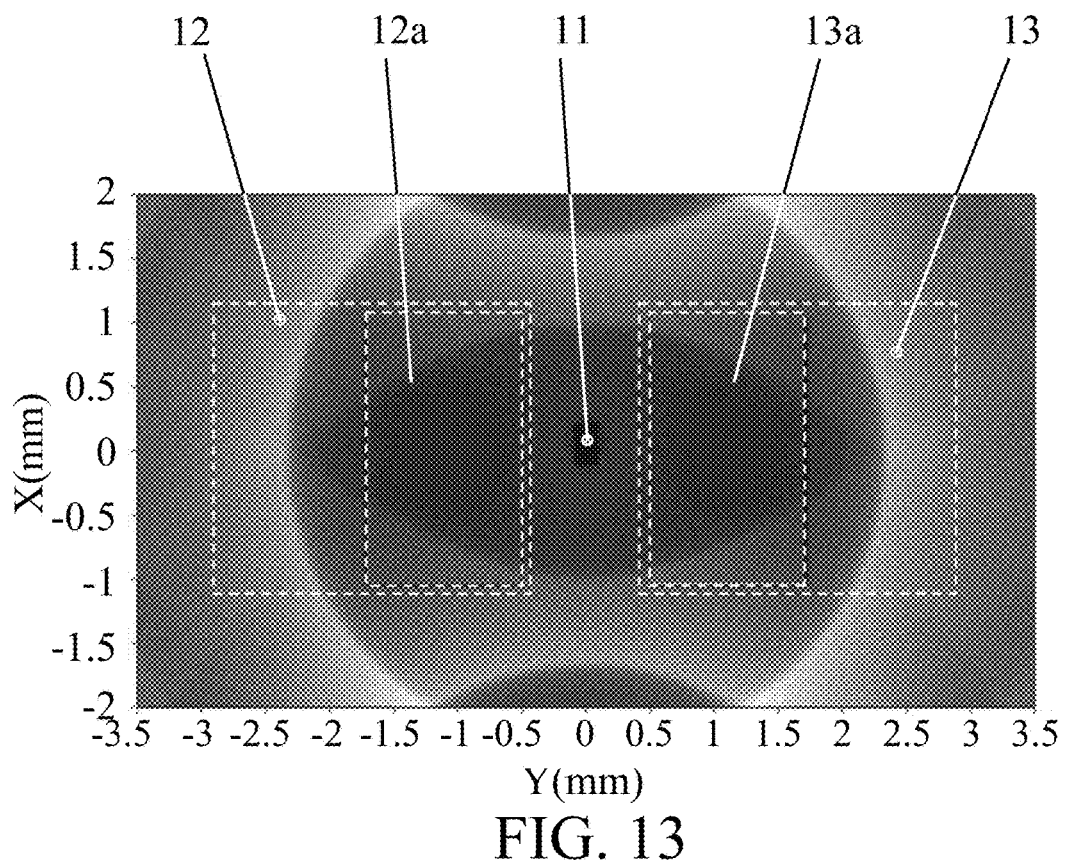
FIG. 13 is an illuminance distribution diagram in the section taken along the line PL-PL in FIG. 7 when the conditional expression (2) is not satisfied.
Figure 14:
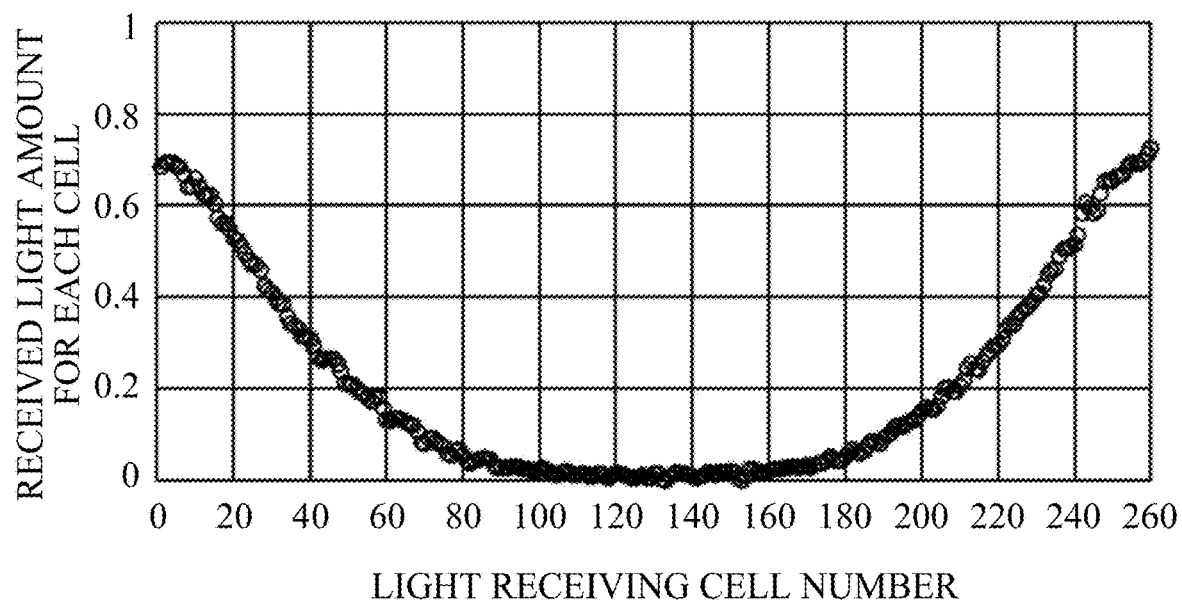
FIG. 14 is a graph of the received light amount in each light receiving cell in the light receiving element in FIG. 13.

FIG. 11 is an illuminance distribution diagram of the reflected light from the top surface 14c in a section taken along a line PL-PL in FIG. 7 where the scale 50 is removed when the conditional expression (2) is satisfied. FIG. 12 is a graph of the received light amount in each light receiving cell in the light receiving element 12 in FIG. 11. FIG. 13 is an illuminance distribution diagram of the reflected light from the top surface 14c in the section taken along the line PL-PL in FIG. 7 when the scale 50 is removed when the conditional expression (2) is not satisfied. FIG. 14 is a graph of the received light amount in each light receiving cell in the light receiving element 12 in FIG. 13.

In FIGS. 11 and 13, the light emitting element 11 is located at the black square position at the center. Positions corresponding to the light receiving element 12 and the light receiver 12a are indicated by dotted lines on the left side of the light emitting element 11. Positions corresponding to the light receiving element 13 and the light receiver 13a are indicated by dotted lines on the right side of the light emitting element 11. The closer to white the color is, the higher the illuminance of the reflected light from the top surface 14c is, and the closer to black the color is, the lower the illuminance is.

If the conditional expression (2) is not satisfied, the light totally reflected on the top surface 14c and then totally reflected on the side surface 14d enters the light receivers 12a and 13a as described above. By satisfying the conditional expression (2), as compared with the case where the conditional expression (2) is not satisfied in FIG. 13, the illuminance in the light receivers 12a and 13a can be reduced as shown in FIG. 13. Therefore, as compared with the case where the conditional expression (2) is not satisfied in FIG. 14, as shown in FIG. 12, the received light amount for any of the light receiving cells can be reduced. In other words, the configuration according to this embodiment can restrain the internally reflected light from entering the light receivers 12a and 13a.

As described above, the configuration according to this embodiment can provide the compact reflection type sensor 10 and the optical encoder 100 having the same, each of which can reduce the influence of internally reflected light.

Second Embodiment

A basic configuration of the optical encoder 100 according to this embodiment is the same as that of the optical encoder 100 according to the first embodiment. This embodiment will discuss a configuration different from the optical encoder 100 of the first embodiment. The optical encoder 100 according to this embodiment has a reflection type sensor 20 having a configuration different from that of the first embodiment.

Figure 15:
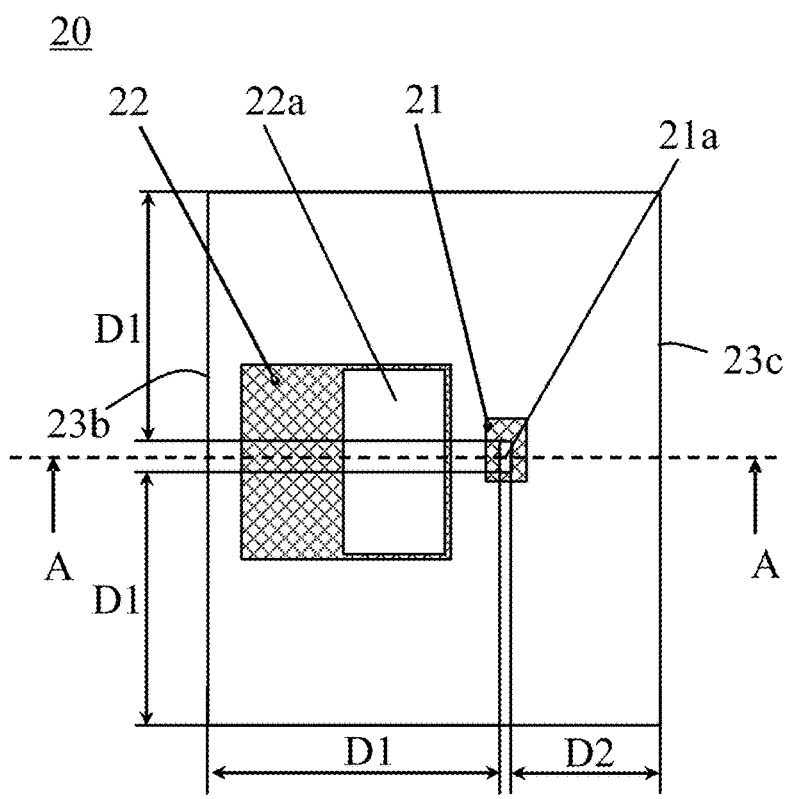
FIG. 15 is a top view of a reflection type sensor according to a second embodiment.
Figure 16:
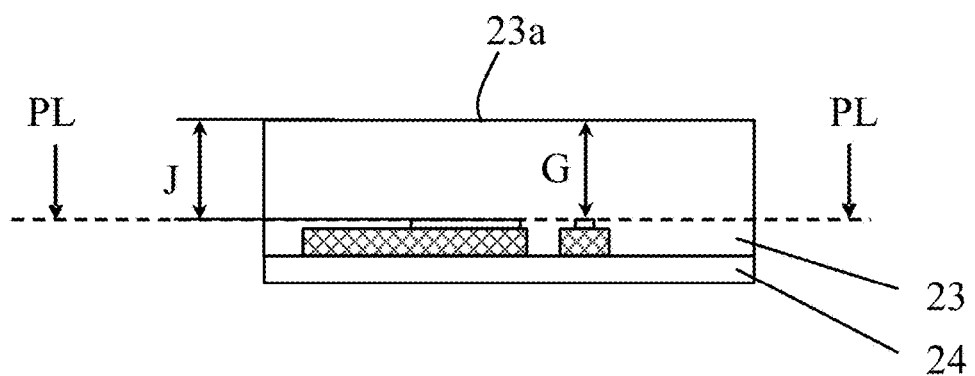
FIG. 16 is a side view of the reflection type sensor according to the second embodiment.
Figure 17:
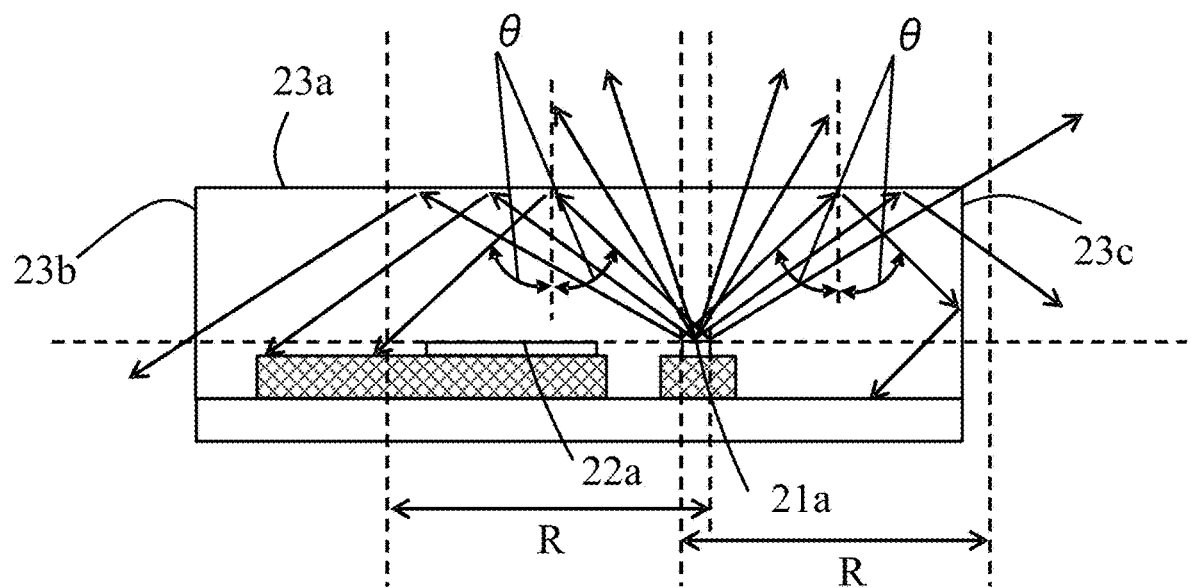
FIG. 17 is a sectional view taken along a line A-A in FIG. 15.

FIGS. 15 and 16 are a top view and a side view of the reflection type sensor 20 according to this embodiment, respectively. FIG. 17 is a sectional view taken along a line A-A in FIG. 15.

The reflection type sensor 20 has a light emitting element 21, a light receiving element 22, a transparent member 23, and a nonreflective member 24. In the first embodiment, the reflection type sensor 10 has a plurality of light receiving elements, but in this embodiment, the reflection type sensor 20 has a single light receiving element 22. The light emitting element 21 includes a light emitter 21a that emits light. The light receiving element 22 includes a light receiver 22a that receives the reflected light from the scale 50. The light emitting element 21 and the light receiving element 22 are disposed on the nonreflective member 24.

Similar to the first embodiment, this embodiment disposes the light receiver 22a between the end (first end) of the light emitter 21a and the position separated from the first end by the distance R. This configuration can restrain the noise light totally reflected by the top surface 23a of the transparent member 23 from entering the light receiver 22a. Similar to the first embodiment, the end (second end) facing the end (first end) of the light emitter 21a is disposed between the end (first end) of the light emitter 21a and a position separated from the first end by the distance R.

In this embodiment, similar to the first embodiment, the distance D1 from the end (second end) of the light emitter 21a to the side surface 23b of the transparent member 23 around which the light receiving element 22 is disposed satisfies the conditional expression (2). This configuration can restrain the light totally reflected on the top surface 23a and the side surface 23b of the transparent member 23 from entering the light receiver 22a.

Figure 18:
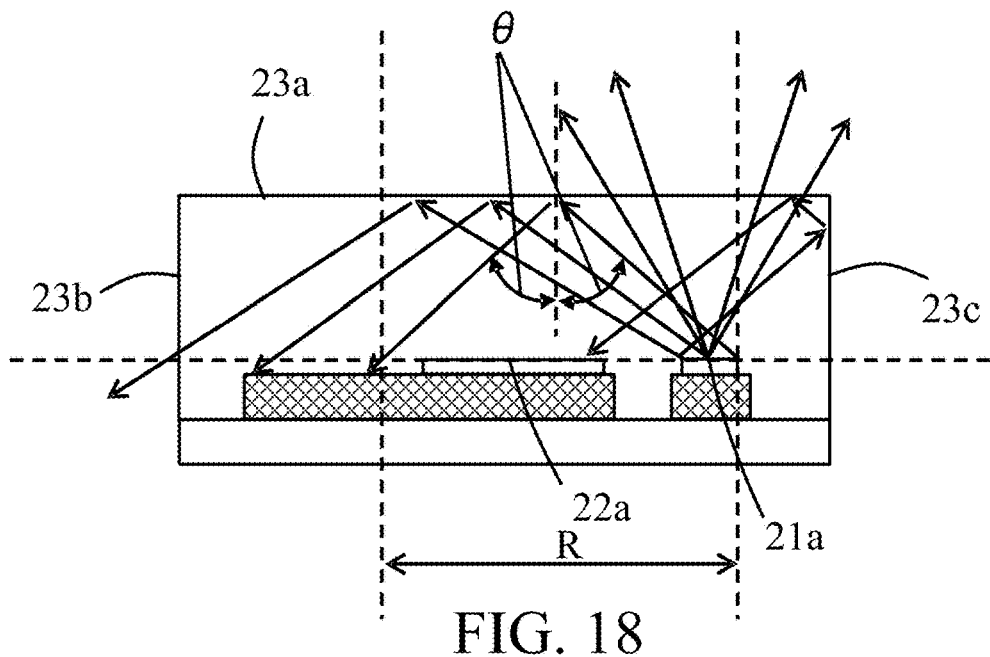
FIG. 18 is a sectional view corresponding to a section taken along the line A-A in FIG. 15 when a conditional expression (3) is not satisfied.

Since this embodiment provides only the single light receiving element 22, the side surface 23c on the side opposite to the side where the light receiving element 22 can be made closer to the light emitter 21a than the other side surface 23b. Thereby, the transparent member 23 can be made smaller than the transparent member 14 according to the first embodiment. However, if the side surface 23c is brought too close to the light emitter 21a, the light totally reflected on the side surface 23c and then totally reflected on the top surface 23a may enter the light receiver 22a as shown in FIG. 18. According to this embodiment, the shortest distance D2 from the end of the light emitter 21a to the side surface 23c (or the distance from the end of the light emitter 21a to the side surface 23c to which the end of the light emitter 21 is the closest) satisfies the following conditional expression (3).

$$D2 > G/\tan\theta \qquad (3)$$

Satisfying the conditional expression (3) can restrain the light totally reflected on the side surface 23c closest to the end of the light emitter 21a and the top surface 23a from entering the light receiver 22a.

Figure 19:
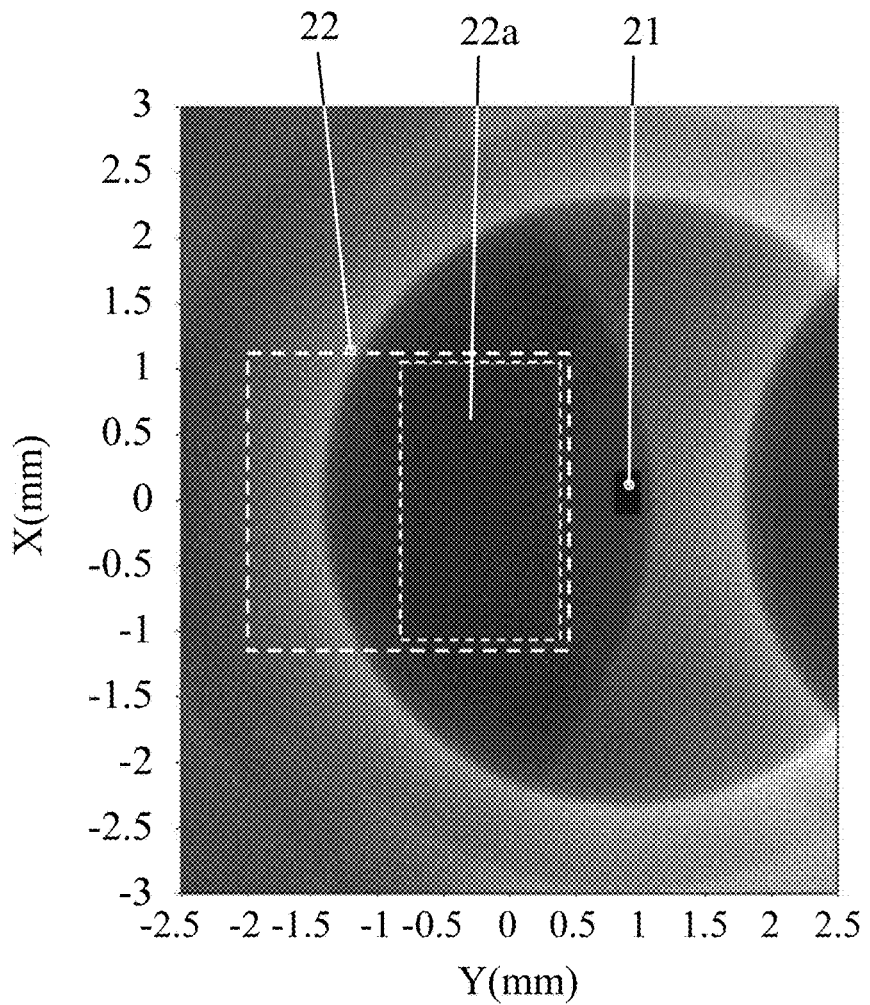
FIG. 19 is an illuminance distribution diagram in a section taken along a line PL-PL in FIG. 16 when the conditional expression (3) is satisfied.
Figure 20:
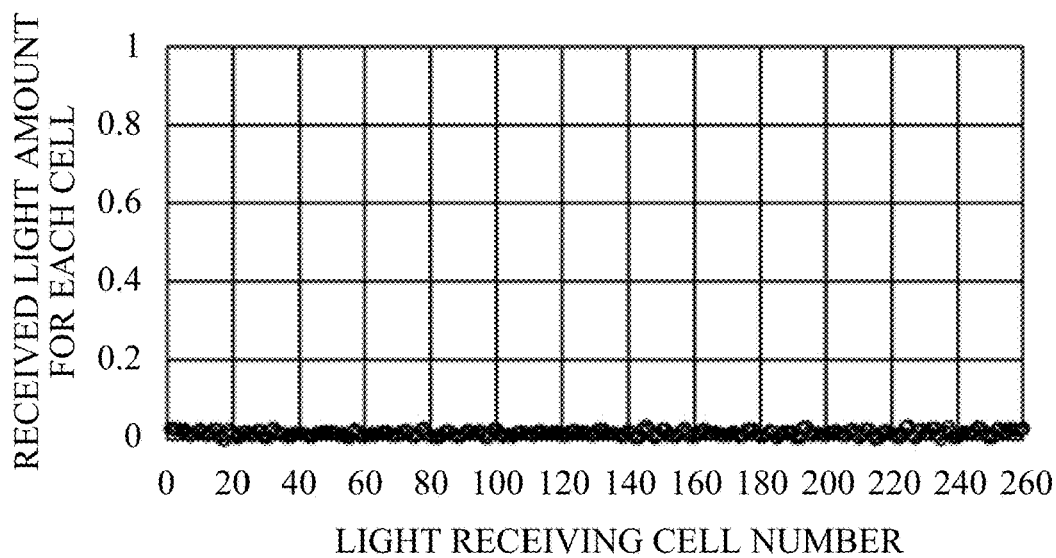
FIG. 20 is a graph of a received light amount in each light receiving cell in the light receiving element in FIG. 19.
Figure 21:
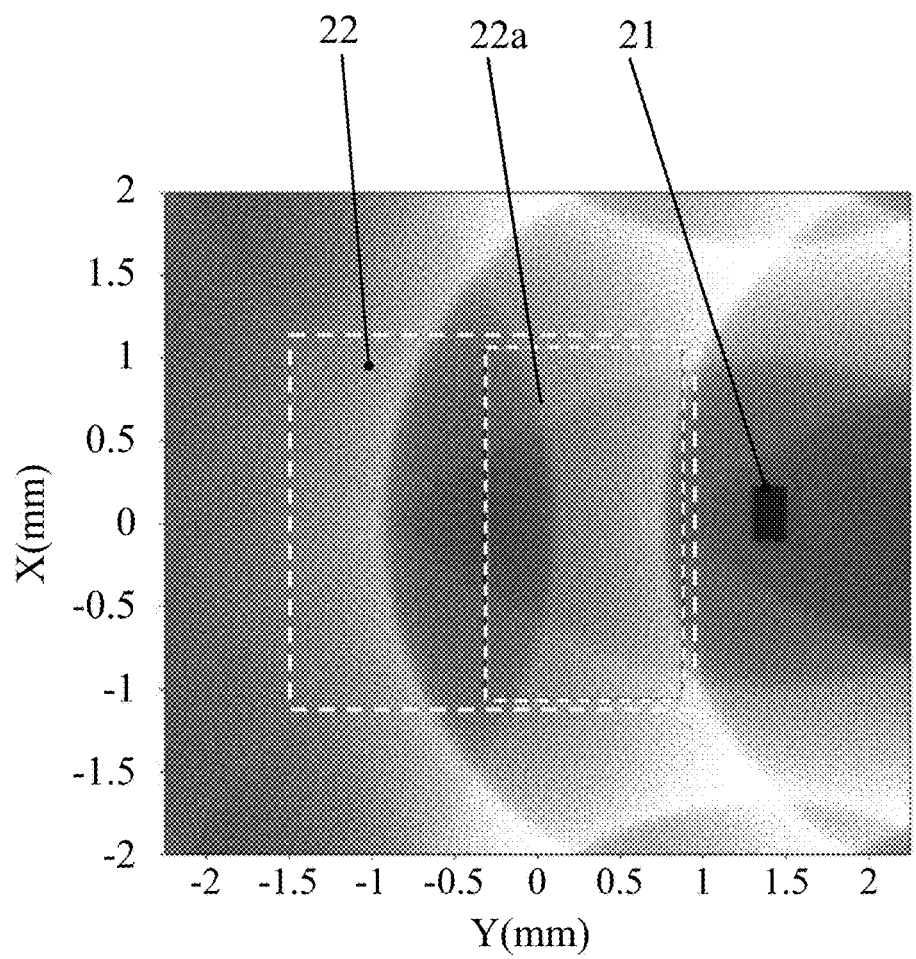
FIG. 21 is an illuminance distribution diagram in the section taken along the line PL-PL in FIG. 16 when the conditional expression (3) is not satisfied.
Figure 22:
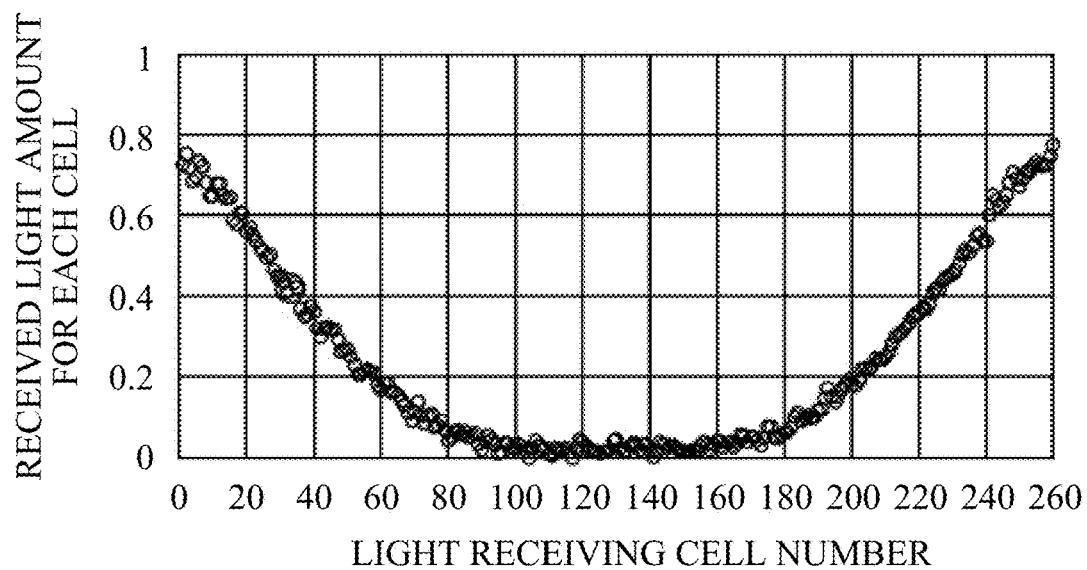
FIG. 22 is a graph of the received light amount in each light receiving cell in the light receiving element of FIG. 21.

FIG. 19 is an illuminance distribution diagram of the reflected light from the top surface 23a in the section taken along the line PL-PL in FIG. 16 when the scale 50 is removed when the conditional expression (3) is satisfied. FIG. 20 is a graph of the received light amount in each light receiving cell in the light receiving element 22 in FIG. 19. FIG. 21 is an illuminance distribution diagram of the reflected light from the top surface 23a in the section taken along the line PL-PL in FIG. 16 where the scale 50 is removed when the conditional expression (3) is not satisfied. FIG. 22 is a graph of the received light amount in each light receiving cell in the light receiving element 22 in FIG. 21.

In FIGS. 19 and 21, the light emitting element 21 is located at the black square position. Positions corresponding to the light receiving element 22 and the light receiver 22a are indicated by dotted lines on the left side of the light emitting element 21. Similar to the first embodiment, a color closer to white indicates a part with a higher illuminance due to the reflected light from the top surface 23a, and a color closer to black indicates a part with a lower illuminance.

When the conditional expression (3) is not satisfied, as described above, the light totally reflected on the side surface 23c closest to the end of the light emitter 21a and then totally reflected on the top surface 23a enters the light receiver 22a. By satisfying the conditional expression (3), the illuminance at the light receiver 22a can be made lower as shown in FIG. 21 than that in a case where the conditional expression (3) is not satisfied in FIG. 23. Therefore, the received light amount in any of the light receiving cells can be made smaller as shown in FIG. 22 than that in a case where the conditional expression (3) in FIG. 24 is not satisfied. That is, the configuration according to this embodiment can restrain the internally reflected light from entering the light receiver 22a.

As described above, the configuration according to this embodiment provides the reflection type sensor 20 smaller than that of the first embodiment and an optical encoder 100 including the reflection type sensor 20, each of which can reduce the influence of the internally reflected light.

Third Embodiment

A basic configuration of the optical encoder 100 according to this embodiment is the same as that of the optical encoder 100 of the first embodiment. This embodiment will discuss a configuration different from the optical encoder 100 of the first embodiment. The optical encoder 100 according to this embodiment has a reflection type sensor 30 having a configuration different from that of the first embodiment.

Figure 23:
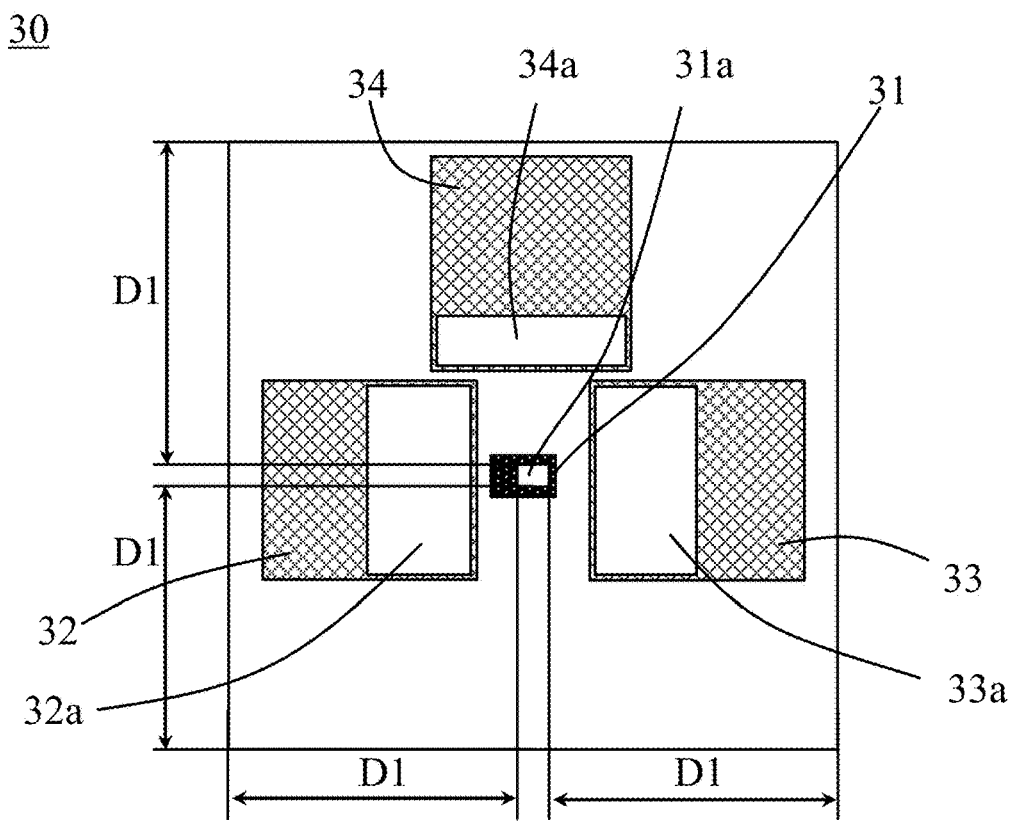
FIG. 23 is a top view of a reflection type sensor according to a third embodiment.
Figure 24:
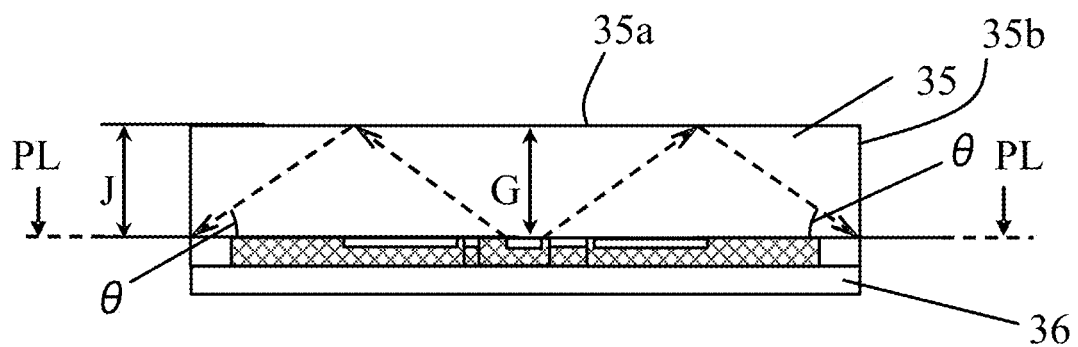
FIG. 24 is a side view of the reflection type sensor according to the third embodiment.

FIGS. 23 and 24 are a top view and a side view of the reflection type sensor 30 according to this embodiment, respectively.

The reflection type sensor 30 has a light emitting element 31, light receiving elements 32, 33, and 34, a transparent member 35, and a nonreflective member 36. Unlike the first and second embodiments, the reflection type sensor 30 according to this embodiment has three light receiving elements 32, 33, and 34. The light emitting element 31 includes a light emitter 31a that emits light. The light receiving elements 32, 33, and 34 include light receivers 32a, 33a, and 34a for receiving the reflected light from the scale 50, respectively. The light emitting element 31 and the light receiving elements 32, 33, and 34 are disposed on the nonreflective member 36.

In this embodiment, similar to the first and second embodiments, the light receivers 32a, 33a, and 34a are disposed between the end (first end) of the light emitter 31a and the position separated from the first end by the distance R. This configuration can restrain the noise light totally reflected by the top surface 35a of the transparent member 35 from entering the light receivers 32a, 33a, and 34a. Similar to the first and second embodiments, the end (second end) facing the end (first end) of the light emitter 31a is located between the end (first end) of the light emitter 31a and a position separated from the first end by the distance R.

In this embodiment, similar to the first and second embodiments, the distance D1 from the end (second end) of the light emitter 31a to the side surface 35b of the transparent member 35 satisfies the conditional expression (2). This configuration can restrain the light totally reflected from the top surface 35a and the side surface 35b from entering the light receivers 32a, 33a, and 34a.

Figure 25:
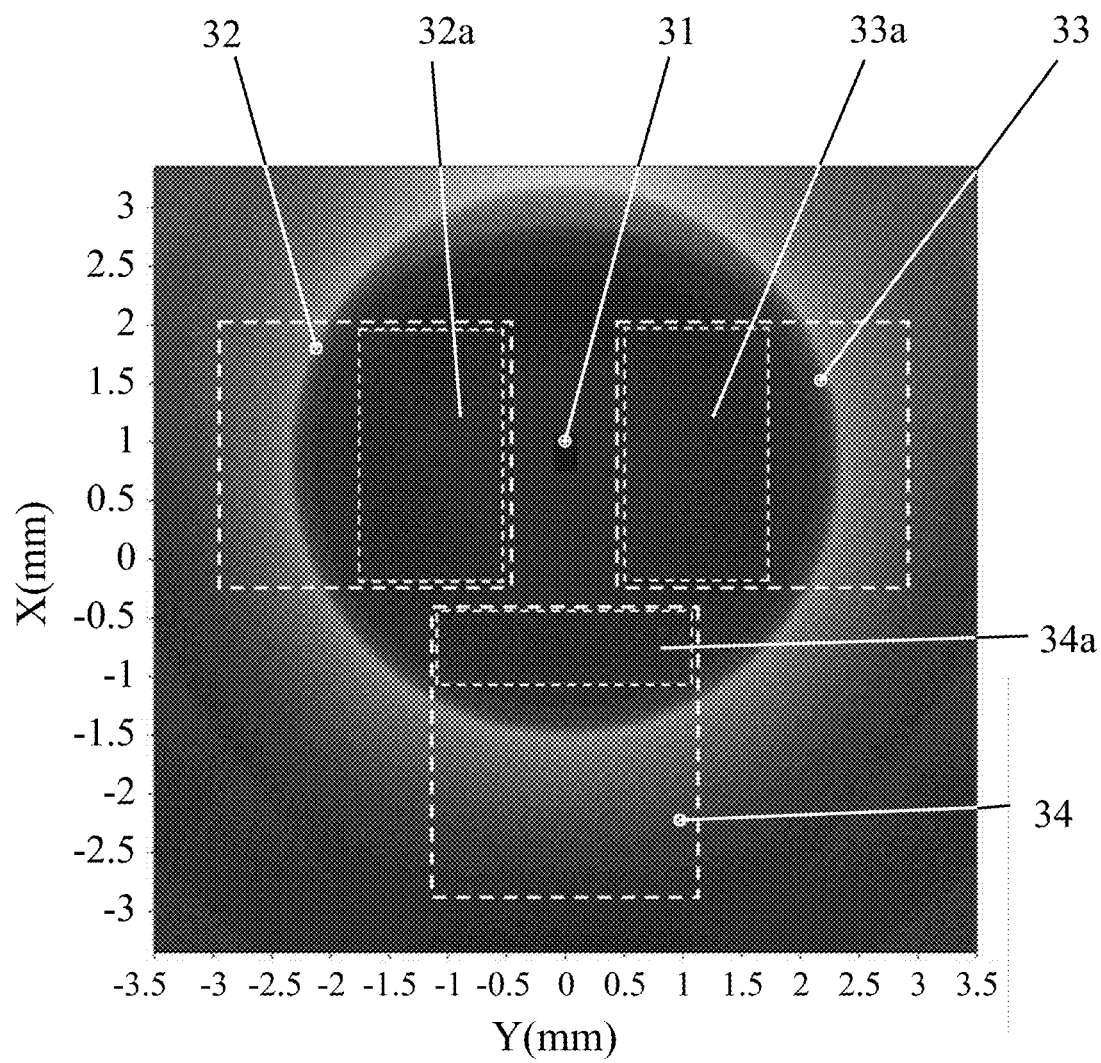
FIG. 25 is an illuminance distribution diagram in a section taken along a line PL-PL in FIG. 24 when the conditional expression (2) is satisfied.
Figure 26:
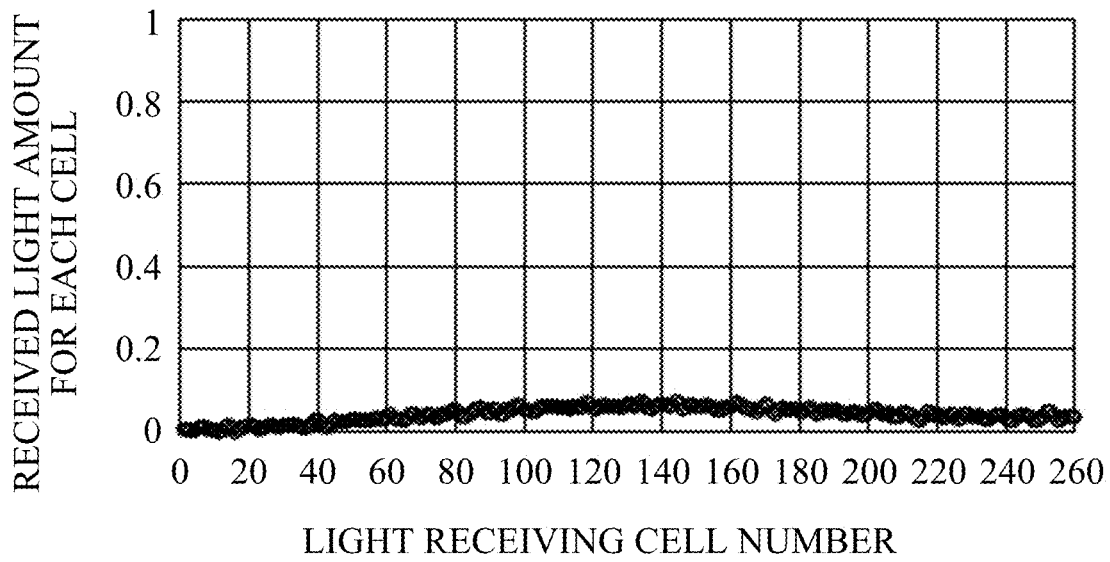
FIG. 26 is a graph of a received light amount in each light receiving cell in the light receiving element in FIG. 25.
Figure 27:
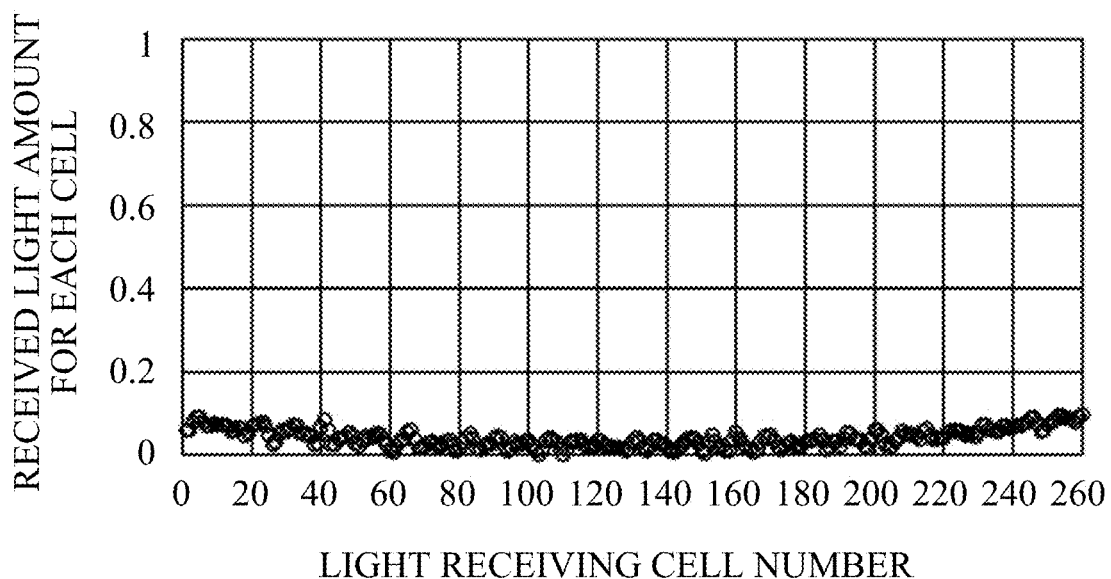
FIG. 27 is a graph of the received light amount in each light receiving cell in the light receiving element in FIG. 25.
Figure 28:
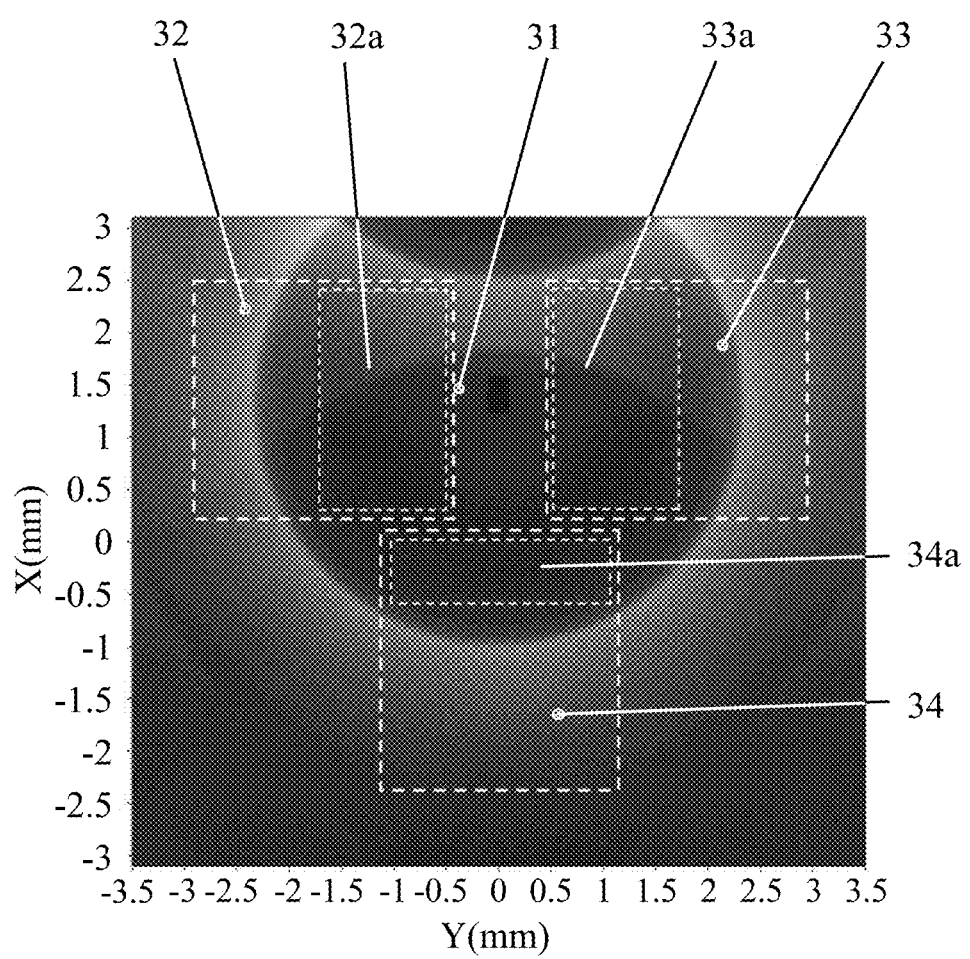
FIG. 28 is an illuminance distribution diagram in the section taken along the line PL-PL in FIG. 24 when the conditional expression (2) is not satisfied.
Figure 29:
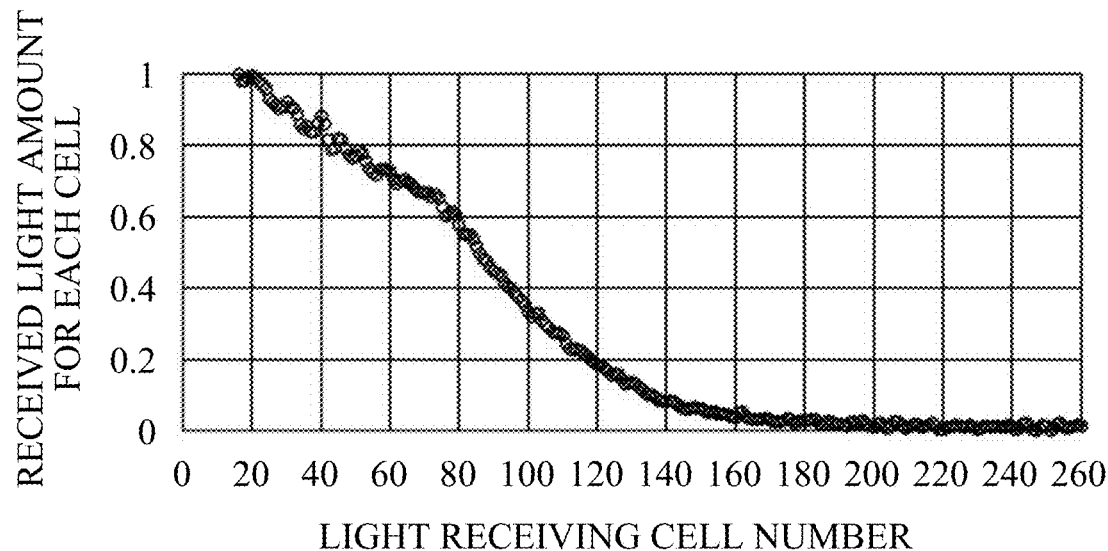
FIG. 29 is a graph of a received light amount in each light receiving cell in the light receiving element of FIG. 28.
Figure 30:
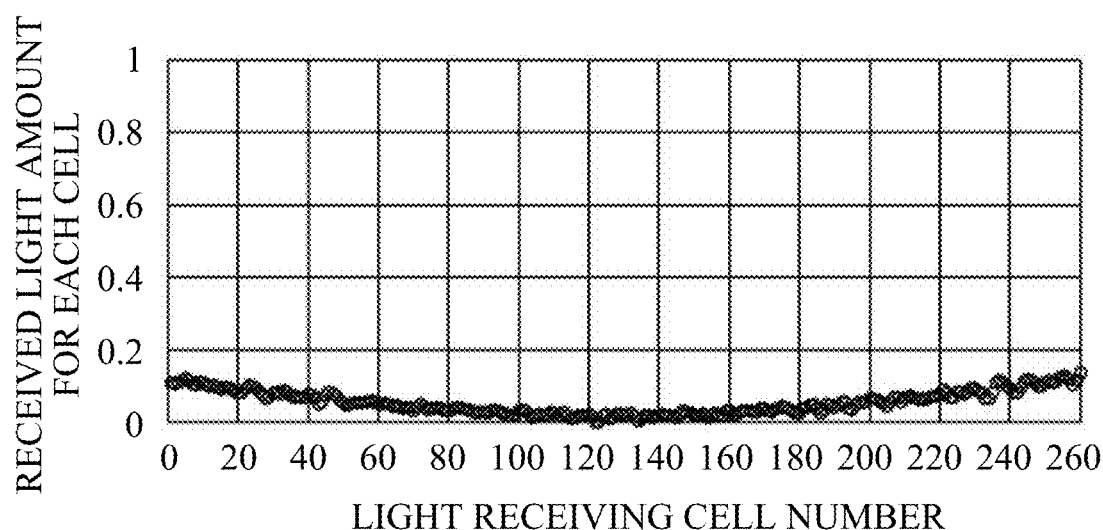
FIG. 30 is a graph of the received light amount in each light receiving cell in the light receiving element in FIG. 28.

FIG. 25 is an illuminance distribution diagram of the reflected light from the top surface 35a in the section taken along the line PL-PL in FIG. 24 where the scale 50 is removed when the conditional expression (2) is satisfied. FIGS. 26 and 27 are graphs of the received light amount in each light receiving cell in the light receiving elements 32 and 34 in FIG. 25, respectively. FIG. 28 is an illuminance distribution diagram of the reflected light from the top surface 35a in the section taken along the line PL-PL in FIG. 24 where the scale 50 is removed when the conditional expression (2) is not satisfied. FIGS. 29 and 30 are graphs of the received light amount in each light receiving cell in the light receiving elements 32 and 34 in FIG. 28, respectively.

In FIGS. 25 and 28, the light emitting element 31 is located at the black square position. The positions corresponding to the light receiving element 32 and the light receiver 32a are indicated by dotted lines on the left side of the light emitting element 31. The positions corresponding to the light receiving element 33 and the light receiver 33a are indicated by dotted lines on the right side of the light emitting element 31. The positions corresponding to the light receiving element 34 and the light receiver 34a are shown below the light emitter 31 by dotted lines. Similar to the first and second embodiments, a color closer to white indicates a part with a higher illuminance due to the reflected light from the top surface 35a, and a color closer to black indicates a part with a lower illuminance.

When the conditional expression (2) is not satisfied, the light totally reflected on the top surface 35a and then totally reflected on the side surface 35b enter the light receivers 32, 33, and 34. By satisfying the conditional expression (2), the illuminance at the light receiver 22a can be made lower as shown in FIG. 25 than that in a case where the conditional expression (2) is not satisfied in FIG. 28. Thus, the received light amount in any of the light receiving cells can be made smaller as shown in FIGS. 26 and 27 than that in a case where the conditional expression (2) is not satisfied in FIGS. 29 and 30. That is, the configuration of this embodiment can restrain the internally reflected light from entering the light receivers 32a, 33a, and 34a.

As described above, the configuration according to this embodiment can provide the compact reflection type sensor 30 and the optical encoder 100 having the reflection type sensor 30, each of which can reduce the influence of the internally reflected light.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-202624, filed on Nov. 7, 2019, which is hereby incorporated by reference herein in its entirety.

What is claimed is:

1. A reflection type sensor comprising:
   a light emitting element configured to emit light;
   a light receiving element configured to receive reflected light from a scale having a pattern; and
   a transparent member configured to cover the light emitting element and the light receiving element,
   wherein the following conditional expression is satisfied:

$$D1 (G+J)/\tan \theta$$

where G is a distance from a light emitter in the light emitting element to a top surface of the transparent member, J is a distance from a light receiver in the light receiving element to the top surface, θ is an angle at which light emitted from the light emitter is totally reflected on the transparent member, the light receiver is located between a first end of the light emitter and a position apart from the first end by a distance R defined as follows, and $$R=(G+J) \times \tan \theta$$

D1 is a distance from a second end facing the first end of the light emitter to a side surface of the transparent member.

2. The reflection type sensor according to claim 1, wherein the second end is located between the first end and the position apart from the first end by the distance R.

3. The reflection type sensor according to claim 1, wherein the light receiving element includes a single light receiving element, and
   wherein the following conditional expression is satisfied:

$$D2 > G/\tan \theta$$

where D2 is the shortest distance from an edge of the light emitter to the side surface of the transparent member.

4. The reflection type sensor according to claim 1, wherein the light receiving element includes a plurality of light receiving elements.

5. The reflection type sensor according to claim 1, wherein the transparent member is made of a transparent glass and a transparent resin.

6. The reflection type sensor according to claim 1, wherein the transparent member is made of a transparent resin.

7. The reflection type sensor according to claim 1, wherein the light emitting element and the light receiving element are disposed on a nonreflective member.

8. The reflection type sensor according to claim 1, wherein a distance from the light emitter to the top surface is equal to a distance from the light receiver to the top surface.

9. An optical encoder comprising:
a reflection type sensor; and
a scale configured to reflect light from the reflection type sensor,
wherein the reflection type sensor includes:
a light emitting element configured to emit light;
a light receiving element configured to receive reflected light from a scale having a pattern; and
a transparent member configured to cover the light emitting element and the light receiving element,
wherein the following conditional expression is satisfied:

$$D1(G+J)/\tan \theta$$

where G is a distance from a light emitter in the light emitting element to a top surface of the transparent member, J is a distance from a light receiver in the light receiving element to the top surface, θ is an angle at which light emitted from the light emitter is totally reflected on the transparent member, the light receiver is located between a first end of the light emitter and a position apart from the first end by a distance R defined as follows, and $$R=(G+J)\times\tan \theta$$

D1 is a distance from a second end facing the first end of the light emitter to a side surface of the transparent member.

* * * * *